(12) United States Patent
Ramsden

(10) Patent No.: US 7,146,015 B2
(45) Date of Patent: Dec. 5, 2006

(54) FREQUENCY THRESHOLD AUDIO ACTIVITY DETECTOR

(75) Inventor: Martin Hague Ramsden, Lawrenceville, GA (US)

(73) Assignee: Motorola Inc., Schaumburg, IL (US)

( * ) Notice: Subject to any disclaimer, the term of this patent is extended or adjusted under 35 U.S.C. 154(b) by 769 days.

(21) Appl. No.: 10/015,419

(22) Filed: Dec. 12, 2001

(65) Prior Publication Data

US 2003/0108215 A1    Jun. 12, 2003

(51) Int. Cl.
| | |
|---|---|
| H03F 21/00 | (2006.01) |
| H03F 3/38 | (2006.01) |
| H03F 1/04 | (2006.01) |
| H03F 3/217 | (2006.01) |
| H03G 5/00 | (2006.01) |
| H04R 29/00 | (2006.01) |
| H04B 15/00 | (2006.01) |

(52) U.S. Cl. ................ 381/120; 381/98; 381/94.1; 381/94.5; 381/56; 330/10; 330/207 A; 330/251

(58) Field of Classification Search ........... 381/91.5, 381/94.5, 120; 700/94; 330/251, 207 A, 330/10
See application file for complete search history.

(56) References Cited

U.S. PATENT DOCUMENTS

| | | | | |
|---|---|---|---|---|
| 4,164,714 A | * | 8/1979 | Swanson | ............ 330/10 |
| 4,723,292 A | * | 2/1988 | Taylor | ............ 381/56 |
| 5,077,540 A | * | 12/1991 | Keith et al. | ............ 330/251 |
| 5,678,200 A | * | 10/1997 | Levi | ............ 455/88 |
| 5,805,020 A | * | 9/1998 | Danz et al. | ............ 330/10 |
| 5,812,598 A | * | 9/1998 | Sharma et al. | ............ 375/259 |
| 5,915,030 A | * | 6/1999 | Viebach | ............ 381/94.5 |
| 5,973,368 A | * | 10/1999 | Pearce et al. | ............ 257/368 |
| 6,005,953 A | * | 12/1999 | Stuhlfelner | ............ 381/94.3 |
| 6,476,673 B1 | * | 11/2002 | Takagishi | ............ 330/10 |
| 6,498,531 B1 | * | 12/2002 | Ulrick et al. | ............ 330/10 |
| 6,545,533 B1 | * | 4/2003 | Karki et al. | ............ 330/10 |

* cited by examiner

*Primary Examiner*—Laura A. Grier
(74) *Attorney, Agent, or Firm*—Hisashi D. Watanabe

(57) ABSTRACT

This invention is a circuit that actuates a loudspeaker at input frequencies above a predetermined threshold and mutes the loudspeaker at input frequencies below the threshold. The circuit includes a comparator that generates a pulse train proportional in frequency to an input audio signal. The pulse train is then coupled to a flip flop array. The flip flop array is controlled by a clock having a specified frequency and duty cycle. The clock, in conjunction with the particular number of flip flops, creates a time window in which pulses may pass. The output of the flip flop array is coupled to an enable input of an audio amplifier. When the frequency of the pulse train is great enough to allow a number of pulses equal to or greater than the number of flip flops to pass within the window, the loudspeaker is actuated. Below this frequency, the loudspeaker is muted.

7 Claims, 3 Drawing Sheets

FREQUENCY THRESHOLD AUDIO ACTIVITY DETECTOR

BACKGROUND

1. Technical Field

This invention relates generally to audio detection circuits, and more particularly to filtering detection circuits employing digital counters to actuate a loudspeaker.

2. Background Art

Modern digital cellular telephones communicate using predominantly three protocols: Time Division Multiple Access (TDMA); Code Division Multiple Access (CDMA) and the Global System for Mobile communications (GSM). Each different protocol transmits digital data in a different manner. TDMA divides the call into three time slots, so as to transmit more data. CDMA causes the digital signal to vary according to a defined pattern or "code" before it is transmitted in a spread spectrum. GSM, which is the most popular protocol in the world, digitizes and compresses the digital signal, and then sends it down a channel with other streams of data, each in its own time slot.

In each of these three protocols, data is transmitted in packets or "bursts". The bursts can be problematic for audio engineers because the amplifiers in the phone require large pulses of current to transmit them. These large bursts of current can create noise in the circuitry of the phone. If not properly contained, the noise can be heard on the earpiece loudspeaker. Such noise can degrade the quality of cellular calls.

For example, referring now to FIG. 3, illustrated therein is a typical GSM current waveform 300. The waveform 300 illustrates the current drawn by the phone's power amplifiers from the battery or power supply. The waveform 300 includes a nominal component 301 that is generally on the order of 250 mA. The waveform includes a pulse 302 having a peak 303 amplitude of about 1.7 A and an average of about 1.4 A. The pulse frequency 305 is 217 Hz and the duty cycle 306 is 12.5%. As the frequency 305 is within the audible range of humans, if this waveform couples into the phone's loudspeaker it can become quite a nuisance.

The problem is compounded in speakerphone applications. As power is drawn through the same connector as the audio signal, the pulse waveform often couples to the audio lines. When the cellular phone is coupled to a speakerphone accessory, and the phone is not in a call, the speakerphone must be muted less the user hear an annoying 217 Hz buzz. However, when a call is in place, the speaker must be actuated. Thus, the speakerphone must be able to determine the difference between the 217 Hz pulse and actual audio in order to be able to mute the speaker when no audio is present.

One possible solution to this problem would be to couple the audio signal through a high pass filter that filters out all frequencies above about 220 Hz. Such filters include high order (fourth order or more) Butterworth and Cbebychev filters comprising resistors, capacitors and inductors. The problems with these filters are threefold: First, high-order filters require numerous components and can thus be quite expensive. Second, high order filters introduce poles and zeroes into the frequency response that may cause stability problems in the overall circuit. Third, since the 217 Hz is within the audio range, filtering frequencies below this amount will truncate a portion of the audio information.

There is thus a need for an improved audio detection and filtering circuit.

DETAILED DESCRIPTION OF THE INVENTION

Figure 1:
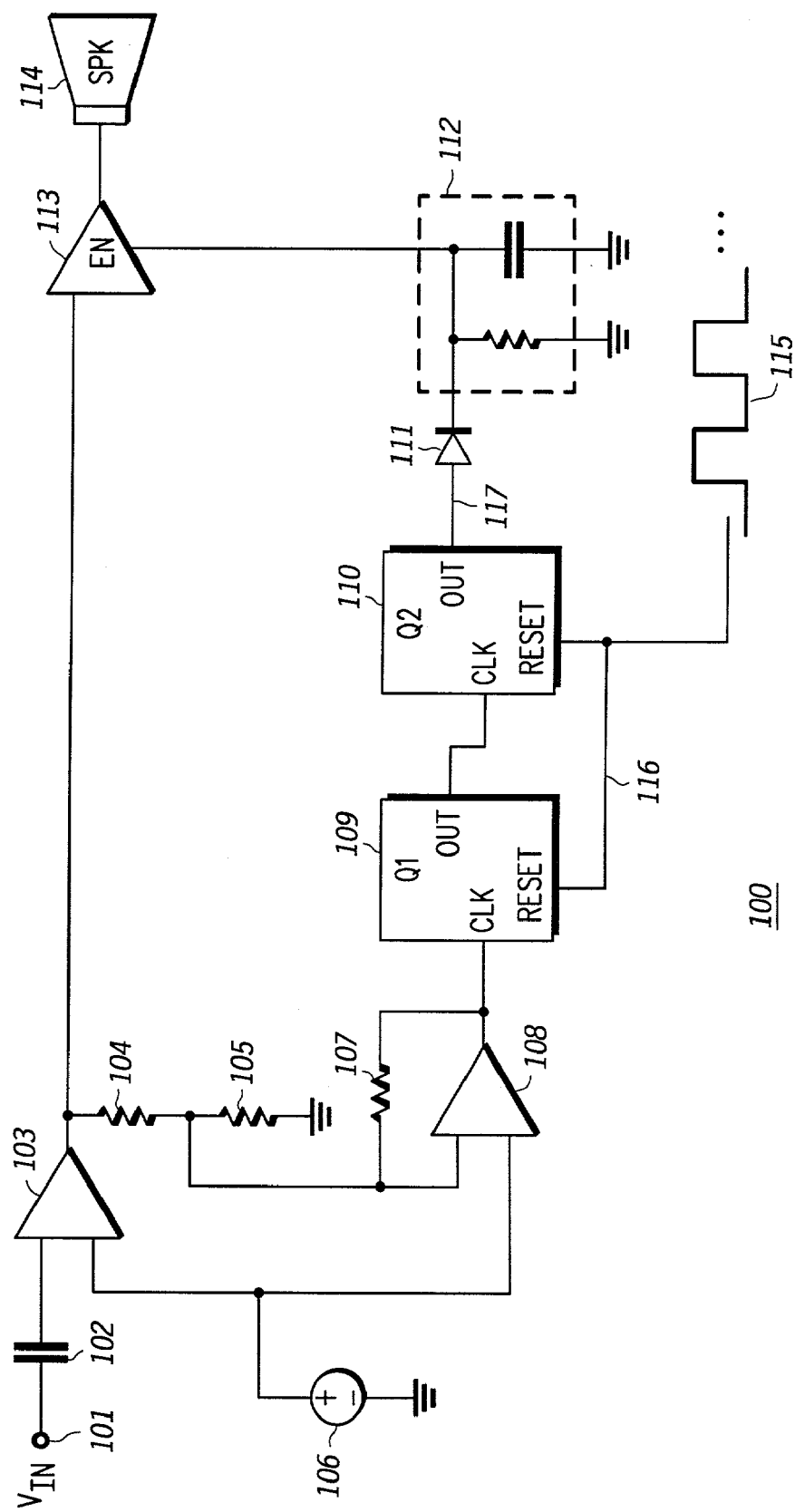
FIG. 1 illustrates a preferred embodiment of an audio detection and filtering circuit in accordance with the invention.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Referring now to FIG. 1, illustrated therein is a preferred embodiment of an audio detection and filtering circuit 100 in accordance with the invention. As noted above, one goal of the invention is to mute a loudspeaker when no call is in progress, where 217 Hz pulses may parasitically appear on the audio lines, and actuate the loudspeaker when audio signals are present. The invention thus solves this problem by inactivating the loudspeaker when frequencies below a predetermined threshold are present, and by actuating the loudspeaker when frequencies above a predetermined threshold are present. This is best explained by way of example.

Audio signals are coupled to the circuit 100 at the input node 101. In this particular embodiment, an optional capacitor 102 provides AC coupling to an amplifier, however the circuit 100 operates equally well with DC coupling. DC coupling is appropriate where the audio signal has a sufficient DC bias as to operate in the circuit's preferred operational range. From this point, the audio signal is amplified via a traditional amplification circuit like the op-amp 103 illustrated here.

From the initial amplification, the audio signal is coupled to a secondary amplifier 113 and simultaneously to a resistor divider comprised of resistors 104 and 105. Resistor 104 is typically much smaller in value than resistor 105. These resistors 104,105 provide a means of scaling the amplified audio signal.

From the resistor divider 104,105, the audio signal is coupled to a comparator 108. The comparator 108 compares the amplified audio signal to a reference 106. The comparator 108 thus outputs a pulse train that corresponds to the frequency of the audio signal. When only the 217 Hz waveform is present, the output of the comparator is, of course, a 217 Hz pulse train. However, when audio is present, the audio has frequencies in excess of 217 Hz, and thus the pulse train becomes much higher in frequency. Optional resistor 107 provides hysteresis where necessary.

The pulse train is coupled to an edge triggered flip-flop array, shown in this case as a ripple counter comprising counter 109 and counter 110. In this preferred embodiment the ripple counter is a two-stage counter. It will be clear to those having ordinary skill in the art, however, that any number of counters may be used depending upon the application.

Counter 109 and 110 are driven by a clock 115 signal that is coupled to the reset pins 116. The clock 115 establishes a "window" during which pulses applied to the input of the ripple counter are clocked completely through counter 109 and counter 110. By tailoring the clock's 115 frequency and duty cycle, one may design a frequency threshold below which no input pulses will pass through the counters 109, 110.

By way of example, in the problem stated above it is desirable to mute the speaker 114 below about 250 Hz and enable the speaker 114 for frequencies higher than 250 Hz. If the clock 115 frequency is set to 120 Hz with a duty cycle of 50%, the "window" created is expressed as $$1/(120*2)=4.1 \ ms \qquad (Eq.1)$$

Beyond the 4.1 msec window, counter 109 and counter 110 are reset. For the output 117 of counter 110 to change, the pulse train from the comparator must have a frequency greater than 240 Hz, which corresponds to at least two pulses within the 4.1 ms window.

Once the output 117 of counter 110 changes, this actuates the secondary amplifier 113. Once the output 117 of counter 110 changes, the blocking diode 111 and resistor-capacitor combination 112 ensure that the output from the ripple counter remains active for at least one clock 115 reset cycle. This delay prevents the secondary amplifier 113 from going inactive at each ripple counter reset. Thus, a period of a least two clock cycles without pulses greater than 240 Hz must pass for the secondary amplifier 113 to be disabled.

It is well to note that the flip-flops 109,110 of FIG. 1 have been drawn in a generic notation. It is known in the art that counters may be constructed with various types of flip-flops including D-latch flip flops, J-K flip-flops and S-R flip-flops. The specific configuration of each counter depends upon the type of flip-flop. For example, using a J-K flip-flop requires the J-K inputs of the first flip-flop to be tied high, while a D-latch flip-flop requires the D-input to be tied to the Q-bar output. On-Semiconductor offers many informative application notes for flip-flops, including the MC14027B dual J-K flip-flop. While the circuits are known to those having ordinary skill in the art, the application notes offer helpful explanations and schematics of application circuits.

Figure 2:
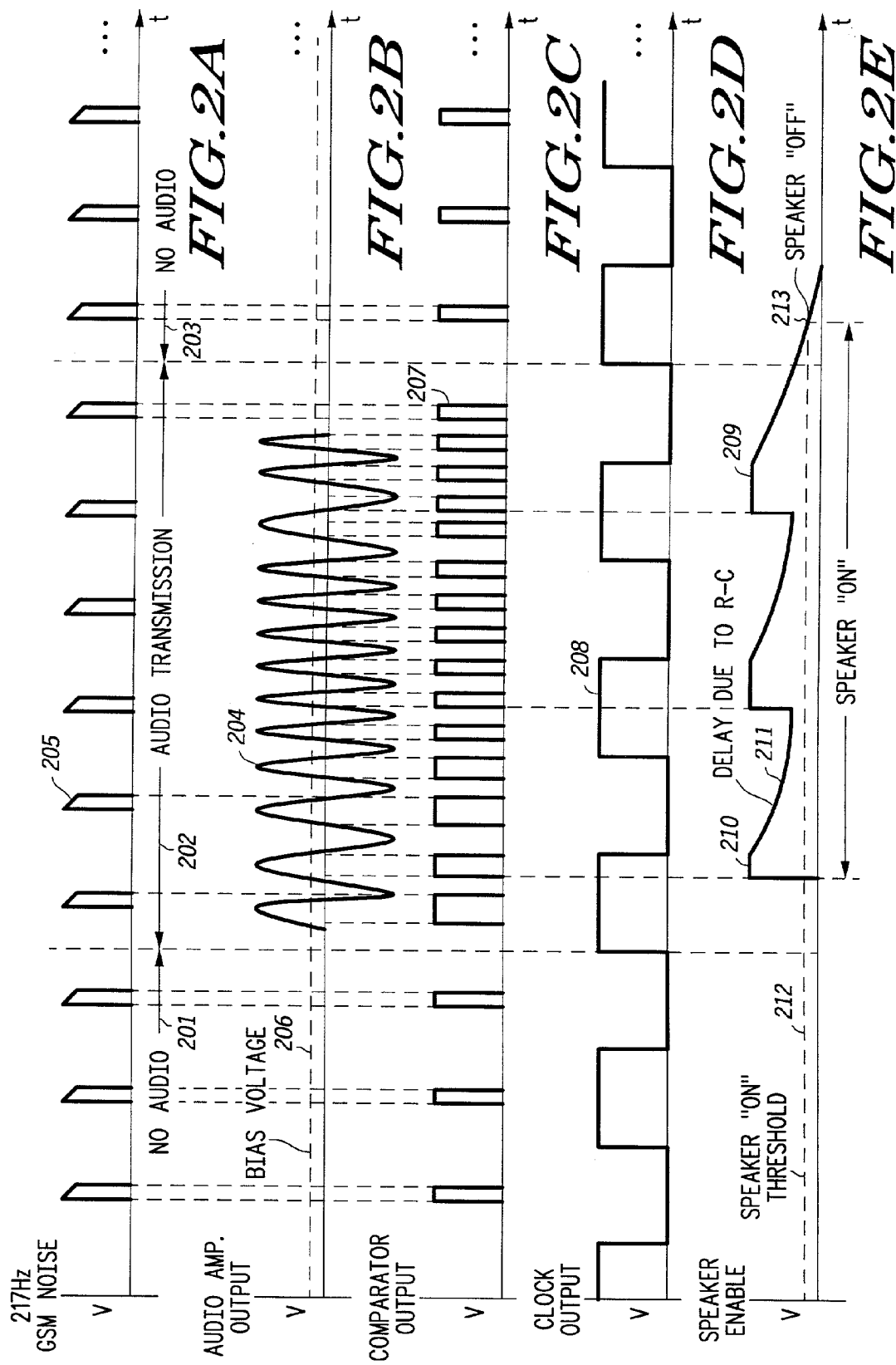
FIGS. 2(a)–2(e) illustrates exemplary waveforms associated with different nodes of an audio detection and filtering circuit in accordance with the invention.
Figure 3:
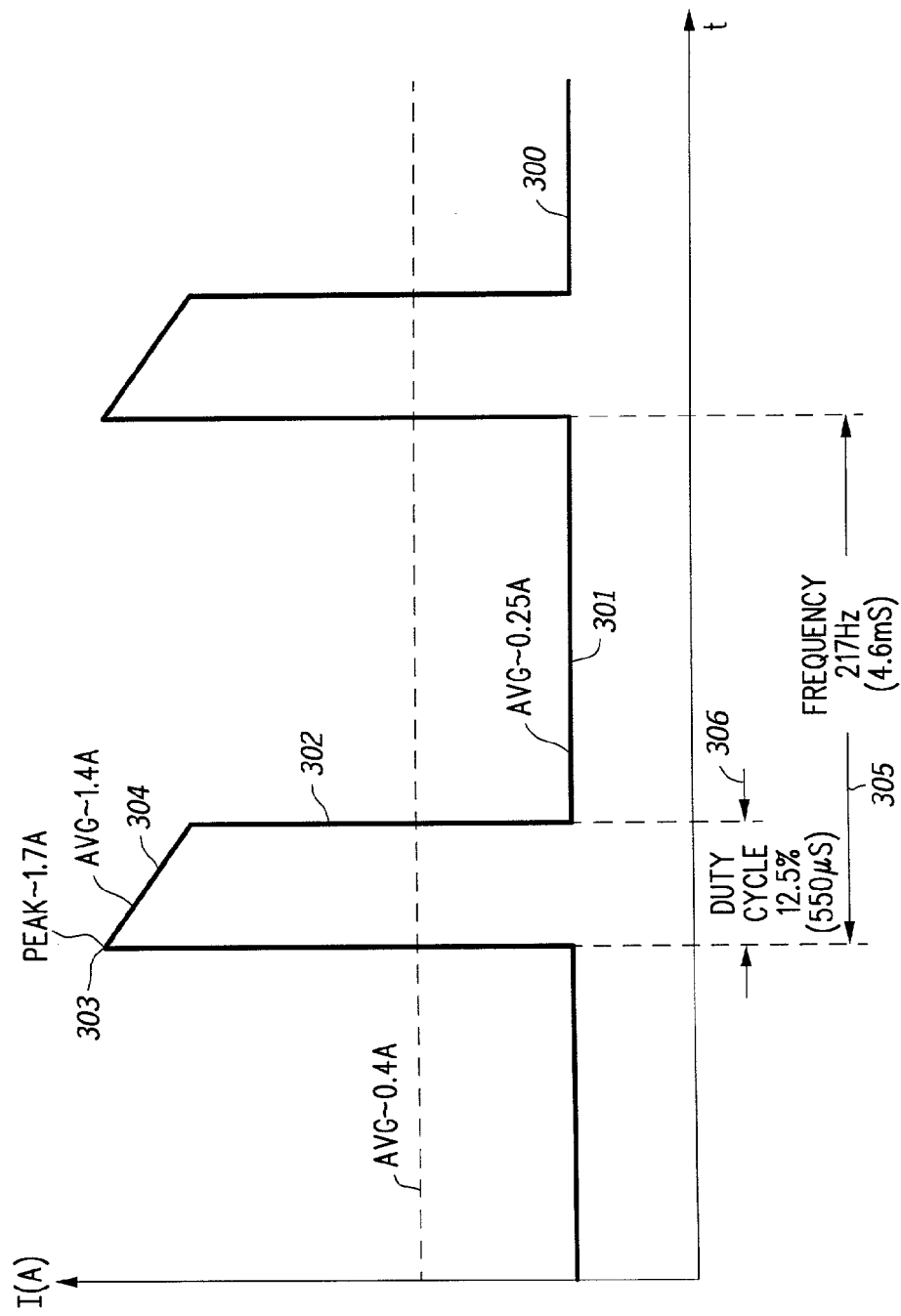
FIG. 3 is an exemplary GSM current waveform associated with portable communications devices.

Referring now to FIG. 2, illustrated therein are waveforms corresponding to the circuit of FIG. 1. FIG. 2(a) illustrates a series of GSM pulses 205 with a frequency of about 217 Hz. These pulses 205 represent the noise presented to an audio accessory by the phone.

FIG. 2(b) illustrates an exemplary audio output. This output corresponds to the signal present at node 101 of FIG. 1. In region 201, where no audio signal is present, the voltage is essentially zero. In region 202, an audio signal 204 is present. As the human ear perceives frequencies between 20 Hz and 20 kHz, the audio signal 204 will include frequency components in excess of 240 Hz.

FIG. 2(c) illustrates the output of a comparator (element 108 of FIG. 1) when the sum of the GSM pulses 205 of FIG. 2(a) and the audio signal 204 of FIG. 2(b) are compared to a voltage threshold 206. The result is a pulse-train 207 corresponding to the input signals 204,205. This pulse train corresponds to the signal delivered to the flip-flops 109,110 of FIG. 1.

FIG. 2(d) illustrates the clock signal 208 that is coupled to the counters. The clock signal 208 corresponds to the signal applied to the flip-flops 109,110 at node 116 in FIG. 1. The exemplary clock signal 208 shown here is 120 Hz with a 50% duty cycle.

FIG. 2(e) illustrates the enable signal 209 coupled to the secondary amplifier 113 of FIG. 1. Recall that two pulses must pass within one window to actuate the enable signal 209. This occurs at point 201. The enable signal would normally go to zero while the clock 208 is low, however the resistor-capacitor 112 of FIG. 1 cause a decay as illustrated by curve 211. The enable signal 209 finally drops below the "on" threshold at point 213.

Refer now back to FIG. 1. In the manner described above, the loudspeaker 114 is disabled when frequencies below 240 Hz are present at the audio input 101, but is actuated when frequencies above this threshold are present. Additionally, the circuit 100 is amplitude independent, which means that the amplitude of the input is irrelevant. As long as the amplitude is sufficient to pass the voltage reference 106 present at the comparator 108, the signal will sufficiently enable the secondary amplifier 113. The result is a quiet loudspeaker below a threshold frequency and an active loudspeaker above this frequency. The invention thus provides improved audio quality.

While the preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims. For example, while the predetermined threshold of this example was set to 240 Hz, it will be clear that this threshold is easily changed by altering the number of counters, the clock frequency and the clock duty cycle.

What is claimed is:

1. An audio detection circuit for overcoming cellular transient noise of a wireless communication device comprising:
    a. an audio signal;
    b. a means of comparing the audio signal to a threshold signal, wherein the means of comparing generates a pulse train having a frequency that varies with the audio signal;
    c. a logic array coupled to the means of comparing, the logic array having an enable control, wherein the logic array is responsive to the pulse train when the enable control is active;
    d. a clock signal having a predetermined frequency and duty cycle coupled to the enable control of the logic array; and
    e. a means for amplifying the audio signal, the means for amplifying having an enable input, wherein the enable input is coupled to the logic array;
    wherein the enable input of the amplifying means is actuated when the audio signal has a frequency component above a predetermined frequency threshold.

2. The circuit of claim 1, wherein the logic array comprises a ripple counter.

3. The circuit of claim 2, wherein the ripple counter comprises at least two flip-flop circuits.

4. The circuit of claim 3, further comprising a loudspeaker coupled to the amplifying means.

5. The circuit of claim 4, wherein the predetermined threshold is at least 217 Hz.

6. An audio detection circuit for overcoming cellular transient noise of a wireless communication device comprising:
    an audio signal;

a means of comparing the audio signal to a threshold signal, wherein the means of comparing generates a pulse train having a frequency that varies with the audio signal;

a logic array coupled to the means of comparing, the logic array having an enable control, wherein the logic array is responsive to the pulse train when the enable control is active;

a clock signal having a predetermined frequency and duty cycle coupled to the enable control of the logic array;

a means for amplifying the audio signal, the means for amplifying having an enable input, wherein the enable input is coupled to the logic array; and a delay circuit coupled to the enable input of the amplifying means;

wherein the enable input of the amplifying means is actuated when the audio signal has a frequency component above a predetermined frequency threshold.

7. An audio detection circuit comprising:

a. an audio signal;

b. a first amplifier coupled to the audio signal;

c. a comparator having a reference voltage coupled to the first amplifier, wherein the comparator generates a pulse train proportional to the frequency of the audio signal;

d. a ripple counter coupled to the comparator, the ripple counter having an enable control, wherein the ripple counter is responsive to the pulse train when the enable control is active;

e. a clock having a predetermined frequency and duty cycle coupled to the enable control of the ripple counter; and f. a second amplifier having an enable input, the enable input being coupled to the ripple counter;

wherein the enable input of the second amplifier is actuated when the audio signal has a frequency component above a predetermined frequency threshold.

* * * * *